United States Patent [19]

Coane

[11] 4,283,483
[45] Aug. 11, 1981

[54] PROCESS FOR FORMING SEMICONDUCTOR DEVICES USING ELECTRON-SENSITIVE RESIST PATTERNS WITH CONTROLLED LINE PROFILES

[75] Inventor: Philip J. Coane, Mahopac, N.Y.

[73] Assignee: Hughes Aircraft Company, Culver City, Calif.

[21] Appl. No.: 59,010

[22] Filed: Jul. 19, 1979

[51] Int. Cl.$^3$ .......................................... H01L 21/283
[52] U.S. Cl. .................................. 430/296; 156/643; 427/88; 430/312; 430/314; 430/942
[58] Field of Search ............... 430/296, 314, 312, 942; 427/88; 156/643

[56] References Cited

U.S. PATENT DOCUMENTS

| | | |
|---|---|---|
| 3,849,136 | 11/1974 | Grebe . |
| 3,867,148 | 2/1975 | O'Keeffe . |
| 3,873,361 | 3/1975 | Franco et al. . |
| 3,971,860 | 7/1976 | Broers ................................. 29/576 R |
| 4,024,293 | 5/1977 | Hatzakis ............................... 427/273 |
| 4,109,029 | 8/1978 | Ozdemir ................................ 427/84 |
| 4,165,395 | 8/1979 | Chang .................................. 427/14.1 |

OTHER PUBLICATIONS

Howard et al., "400-Å Linewidth e-beam lithography on Thick Silicon Substrates", Appl. Phys. Lett 36 (7), Apr. 1980, pp. 592–594.
Lyman "Scaling the Barriers to VLSI's Fine Lines" Electronics, Jun. 19, 1980, p. 125.
Ballantyne, "Electron-beam Fabrication of Chromium Master Masks", J. Vac. Sci. Technol., vol. 12, No. 6, Nov./Dec., 1975 pp. 1257–1260.
"Integrated Circuits, Design Principles and Fabrication", Edited by Warner et al., McGraw Hill Book Compnay, N.Y., N.Y., 1965, Chapter 13.
Bersin, "Programmed Plasma Processing: The Next Generation", Kodak Microelectronics Seminar, San Diego, Calif. Oct. 2, 1978.
DeForest, "Photoresist Materials and Processes", McGraw Hill Book Co., N.Y., N.Y., 1975.
Dunkleberger "Stencil Technique for the Preparation of Thin-Film, Josephson Devices", J. of Vac. Sci. Technol. 15, No. 1, Jan./Feb., 1978, pp. 88–90.

Primary Examiner—John D. Smith
Attorney, Agent, or Firm—Mary E. Lachman; W. H. MacAllister

[57] ABSTRACT

The specification describes a process for defining a predetermined region on and above a substrate by using a resist pattern having a controlled line profile. First, a composite electron-beam sensitive resist comprising a bottom layer of resist, a middle layer of a chosen conductive material, and a top layer of resist is formed on a selected substrate. The substrate with the composite resist is exposed to a beam of electrons to simultaneously define a predetermined pattern in the top and bottom layers of the resist. Next, a first chosen solvent is applied for a first predetermined period of time to develop the pattern in the top layer of resist, with the layer of conductive material protecting the bottom layer of resist from exposure of the first chosen solvent. Then, the portion of the conductive layer which is exposed after development of the top resist layer, is removed. Finally, a second chosen solvent is applied for a second predetermined period of time to develop the pattern in the bottom layer of resist and to thereby form a T-shaped profile in the composite resist, which defines the desired region on and above the substrate. In a preferred embodiment of the present invention, metal is subsequently deposited on the defined region of the substrate to form a metal pattern having the same controlled profile as the composite resist.

7 Claims, 9 Drawing Figures

PROCESS FOR FORMING SEMICONDUCTOR DEVICES USING ELECTRON-SENSITIVE RESIST PATTERNS WITH CONTROLLED LINE PROFILES

TECHNICAL FIELD

This invention relates generally to a process for forming semiconductor devices of submicrometer dimensions and, more particularly, to such a process which uses a beam of electrons to expose the desired pattern in a lithographic processing step.

BACKGROUND ART

In the fabrication of semiconductor devices such as field-effect transistors, miniaturization of device geometry has been an important goal not only to provide minimized device size, but also to improve certain device performance characteristics, such as operating speed and frequency response. In the formation of these semiconductor devices, a lithographic process (such as described by William S. DeForest in the book entitled "Photoresist Materials and Processes", McGraw-Hill Book Company, New York, N.Y., 1975) is used to define a pattern having openings of predetermined dimensions, which, in turn, define predetermined regions on the device being formed. Ultraviolet radiation has been used for many years to expose a variety of known photoresist materials. However, this technique is not presently satisfactory for certain high resolution fabrication processes since the ultraviolet radiation itself has limitations with respect to its diffraction and resolution characteristics which are dependent upon the wavelength of the ultraviolet radiation. Thus, in order to overcome these limitations, other resist exposure technologies have been developed which use radiation with wavelengths shorter than those of ultraviolet radiation. One of these new technologies involves the use of a beam of electrons to expose a desired fine pattern in a resist material.

Using one prior art electron beam lithographic process as described, for example by J. P. Ballantyne, in the article entitled "Electron Beam Fabrication of Chromium Master Masks," in the *Journal of Vacuum Science Technology*, Vol. 12, No. 6, Nov.-Dec., 1975, pp. 1257-1260, a metal film is deposited on the surface of the substrate. The metal film is used to subsequently form a metal pattern on the substrate and further serves to subsequently remove negative charges from the electron beam which strikes the substrate so that the substrate does not accumulate a negative charge which would repel additional electrons aimed at the substrate. Next, a thin film, typically one micrometer or less, of a resist material which is sensitive to electron beams is deposited over the metal film. Then, a beam of electrons is used to expose predetermined areas of the resist, either by transmitting the electrons through a suitable mask structure or by successively positioning the electron beam under the direction of a computer program. Next, the exposed resist is developed with a selected solvent which takes advantage of the enhanced dissolution rate of the molecules of resist that were fragmented by exposure to the electron beam. During the development of the exposed resist, the cross-sectional profile of the opening formed depends on the developer solvent. The more active the developer, the greater the influence of increased development time on the profile of the opening and the larger the opening. The walls of the opening formed in the resist may be vertical (i.e., normal to the surface of the substrate), may slope inward from the substrate surface to the top surface of the resist, or may slope outward from the substrate surface to the top surface of the resist, depending on the developer and the conditions used. The vertical wall profile is the most commonly used geometry in the fabrication of devices of submicrometer dimensions.

After the exposed resist has been developed, there remains a resist mask having a pattern of openings in predetermined regions. Then, the portions of the thin metal film exposed by the patterned openings in the resist mask are removed by chemical etching. Finally, the resist mask is removed from the surface of the metal layer by a selective solvent, to leave behind a patterned metal layer having a predetermined configuration. One major disadvantage of such a process is that control of line width is difficult to achieve. During etching of the exposed resist, etching occurs along the width of the desired line pattern as well as along the depth. This isotopic etching causes the etched lines to become wider than desired. In addition, when the metal layer is etched through the patterned resist, the resist material may be attacked by the etchant, which causes the resist material to be lifted and causes the formation of widened and ragged etched metal lines. Also, during the metal etching process, contamination or damage to the surface of the substrate may occur.

In forming devices of submicrometer dimensions, it is desirable to form the contact area of the gate electrode with the substrate, or the gate length, as small as possible in order to increase the frequency and gain at which the device can operate. On the other hand, it is also desirable to decrease the parasitic resistance of the gate electrode, which can be achieved by increasing the total area of the gate electrode. One approach to this problem has been to form a gate electrode with a large aspect ratio (height-to-width ratio), for example, a height of 1.5 micrometers and a width of 0.5 micrometers, which provides a small gate electrode contact area and a large total gate electrode area. However, such electrodes with a large aspect ratio are difficult to fabricate using a standard lithographic process in which the metal layer must be deposited over a patterned resist layer to a thickness of, for example, 1.5 micrometers and then a standard resist lift-off process must be performed in order to form the desired thick metal gate electrode. One basic difficulty in such a process is that as the metal layer is built up by conventional evaporation techniques to form the thick metal gate electrode, it is also built up on the patterned resist layer and this gradually causes a constriction in the pattern opening formed in the resist layer. When forming devices of small dimensions, this constriction, in turn, causes a reduction in the amount of metal deposited along the length dimension of the gate being formed. As a result, the gate so formed has tapered sides and reduced cross-sectional area, which are undesirable in this instance. In addition, the mechanical stresses imposed on a tall, thin metal electrode formed by such prior art processes, particularly for widths less than 0.5 micrometers, tend to tear the metal electrode away from the surface of the substrate. Furthermore, during the lift-off process, the metal layer must be severed to remove the undesired metal and such a severance is difficult to achieve to produce a smooth, reproducible edge when the metal layer is thick.

SUMMARY OF THE INVENTION

The general purpose of this invention is to provide a new and improved process for defining a predetermined region on and above a substrate by using an electronsensitive resist pattern which has a controlled line profile, which possesses most, if not all, of the advantages of the prior art processes while alleviating some of their significant disadvantages as discussed above.

In order to accomplish the above-described general purpose of this invention, I have discovered and developed a new and improved process for defining a predetermined region and on and above a substrate by using a resist pattern having a controlled line profile. This is accomplished by first forming on the selected substrate a composite electron-beam sensitive resist comprising a bottom layer of resist, a middle layer of a chosen conductive material, and a top layer of resist. The substrate with the composite resist is exposed to a beam of electrons to simultaneously define a predetermined pattern in the top and bottom layers of the resist. Next, a first chosen solvent is applied for a first predetermined period of time to develop the pattern in the top layer of resist, with the layer of conductive material protecting the bottom layer of resist from exposure to the first chosen solvent. Then, the portion of the conductive layer exposed after development of the top resist layer is removed. Finally, a second chosen solvent is applied for a second predetermined period of time to develop the pattern in the bottom layer of resist and to thereby form a T-shaped profile in the composite resist, which defines the desired region on and above the substrate. In a preferred embodiment of the present invention, metal is subsequently deposited on the defined region of the substrate to form a metal pattern having the same controlled profile as the composite resist.

Accordingly, it is an object of the present invention to provide a new and improved process for defining a predetermined region on and above a substrate by using a resist pattern having a controlled line profile.

Another object is to provide a process of the type described in which an electron-sensitive resist is used.

A further object is to provide a process of the type described in which a T-shaped profile is formed in the resist.

Another object of the present invention is to provide a new and improved process for depositing a metal pattern having a controlled profile on a substrate by defining a predetermined region on and above a substrate by using a resist pattern having a controlled line profile and subsequently forming a metal pattern having the same controlled line profile.

Yet another object is to provide a new and improved process for forming a conductive electrode of variable cross-section area.

Another object is to provide a semiconductor device in which the gate electrode has minimized contact area and maximized total cross-section area.

Still another object is to provide a device of the type described which operates at a relatively high frequency and gain and has minimized parasitic resistance.

A feature of the present invention is the use of a composite resist comprising a top layer of resist, a middle layer of a conductive material, and a bottom layer of resist.

These and other objects and advantages of the present invention will become more readily apparent in the following description of the drawings and the examples.

DETAILED DESCRIPTION OF THE INVENTION

Figure 1A:
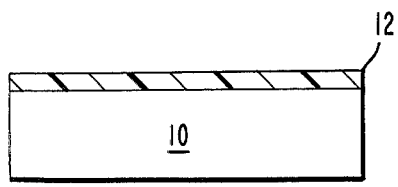
FIGS. 1a-c illustrate, in schematic cross-section, some of the major steps in the formation of the composite structure for the mask of the present invention.
Figure 1B:
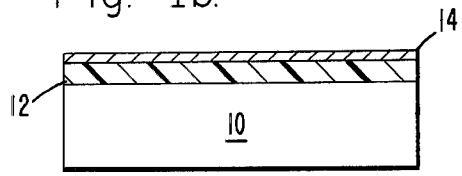

In FIG. 1a, there is shown a substrate 10, such as an epitaxial layer of gallium arsenide or silicon, typically 0.3 micrometers thick and doped with an n-type impurity such as S, Te, or Si to a concentration of $10^{17}$ atoms per cubic centimeter. The epitaxial layer may be deposited on a variety of known semi-insulating materials. On the surface of the substrate 10, there is deposited a layer 12 of a resist which is sensitive to electron beams, such as polymethylmethacrylate. The resist is deposited by well-known spin coating techniques in which, for example, a plurality of substrates are placed on a support table, provided with a few drops of the coating solution, and then rotated with circular rotational speed sufficient to centrifugally spin the coating solution uniformly and radially across the upper surfaces of the substrates. The resist layer 12 is deposited to a predetermined thickness, for example, 3000 Å. After deposition of layer 12, the structure of FIG. 1a is heated at 180° C. for 45 minutes to drive out the solvent carrier used to form the resist coating solution. Next, as shown in FIG. 1b, a thin layer 14 of a chosen conductive material is deposited on the resist layer 12. A conductive material is used so that it will remove the negative charges from the electron beam which strike the substrate, to prevent an accumulation of negative charge and subsequent repulsion of electron beams aimed at the substrate. The conductive material can be any etchable material which can be easily deposited as a thin film which has good adhesion characteristics and which requires a solvent for etching that does not degrade the resist material used. If the chosen conductive material is intrinsically pure, non-doped germanium having a resistivity of approximately 40 ohm-centimeters, it is deposited to a predetermined thickness, for example 300 Å, by well-known processes of thermal deposition under vacuum as discussed in "Integrated Circuits, Designs Principles and Fabrication", edited by R. M. Warner, Jr. and J. N. Fordemwalt, McGraw Hill Book Company, New York, N.Y., 1965, Chapter 13. The thickness of the conductive layer 14 may be varied to take advantage of enhanced electron scattering which modifies the resist profile during subsequent processing as discussed in relation to FIG. 2.

Figure 1C:
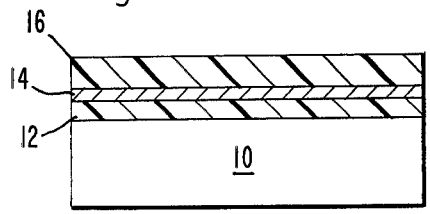

Then, as shown in FIG. 1c, a layer 16 of electron-beam sensitive resist is formed to a predetermined thickness, such as 5000 to 6000 Å, on the conductive layer 14, using known spin-coating techniques. The two resist layers do not have to be of the relative thicknesses shown in FIG. 1c, but may have different thicknesses as required to form specific device structures. It has been found that if the resist layer 12 is thicker than the resist layer 16, the T-shaped electrode subsequently formed will exhibit a dimpled top, which may or may not be satisfactory for the particular device application. However, the purpose of the present invention, namely to have a narrow contact area and yet a thick cross-section, is best accomplished if the cross-bar of the "T" is thick and the base of the "T" is short. This latter requirement is best met if resist layer 16 is thicker than resist layer 12, and is exemplified in FIG. 2e.

Finally, the structure of FIG. 1c is heated for 30 minutes at 145° C. for a gallium arsenide substrate or at 80° C. for a silicon substrate to cure the resist. The structure of FIG. 1c consists of the substrate 10 with a composite structure of resist (layer 12)/conductive material (layer 14)/resist (layer 16) formed thereon and is used in the process described in FIG. 2.

Figure 2A:
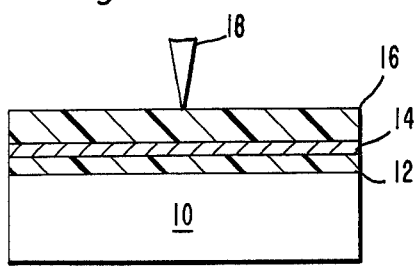
FIGS. 2a-f illustrate, in schematic cross-section, some of the major steps in the process of the present invention.

Turning now to FIG. 2, there is shown in FIG. 2a a structure which was formed as discussed in FIG. 1 and which consists of the substrate 10 having deposited thereon the resist layer 12, the thin layer 14 of a chosen conductive material, and the resist layer 16. The structure of FIG. 2a is then exposed to a beam 18 of electrons in an electron beam microfabrication system (that is, a system in which the position of the electron beam is computer-controlled to define a predetermined pattern), such as described in U.S. Pat. No. 4,109,029, assigned to the present assignee. Optionally the structure of FIG. 2a may be exposed to a beam 18 of electrons which passes through a mask to define a predetermined pattern on the structure. The energy of the electron beam 18 is such that both resist layers 12 and 16 are simultaneously exposed. By varying the charge dose of the electron beam 18, the profile of the pattern exposed in the resist layers 12 and 16 may be varied.

Optionally, in order to form a non-symmetrical T-shaped profile, after the primary line has been exposed, a secondary line may be exposed adjacent to the primary line. The extent of the off-set of the T-shape is determined by the position of the secondary line exposure. A technique of multiple passes is used to permit the shaping of the resist profile of the upper resist layer 16 shown in FIG. 2a without affecting the lower resist layer 12. The total electron beam dose is divided between multiple line exposures to permit the line width of the cross-bar of the T-shaped profile (i.e. the upper resist layer 16) to be increased without affecting the line width of th base of the T (i.e. the lower resist layer 12). Typically, a three-pass line would be used with each pass contributing one-third of the total electron beam dose required for proper resist exposure. Preferably, the lines are placed side-by-side with a typical separation of 0.1 micrometer center-to-center, rather than being aligned one on top of the other, in order to provide a line defining a smooth contour on the walls of the resist when developed. The charge dose of the electron beam and the thickness of the layer 14 of conductive material can be varied as required and used in combination with the technique of multiple pass secondary lines in order to limit exposure of the resist/conductor/resist composite to the top layer of resist while leaving the bottom layer of resist unaffected.

Figure 2B:
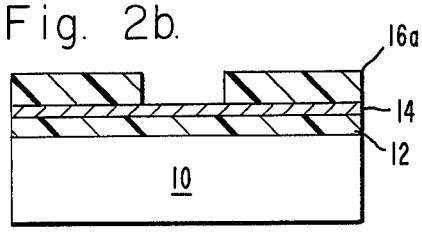
Figure 2C:
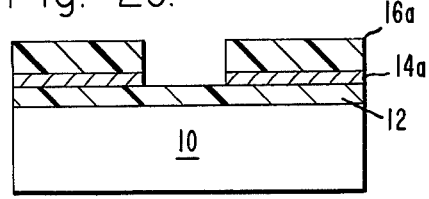
Figure 2D:
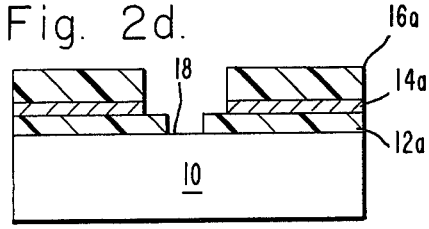

After exposure to the electron beam, the structure of FIG. 2a is immersed in a selected solvent to develop the pattern exposed in the resist layer 16 and to form the patterned resist layer 16a shown in FIG. 2b. While the resist layer 16 is being developed, the conductive layer 14 acts as an impervious barrier to the developer solvent and prevents the solvent from contacting the resist layer 12. Thus, the top resist layer 16 can be developed with an active solvent for a longer period of time than attained by prior art processes. Consequently, the pattern developed in the layer 16 has a profile that is widened but still retains the desirable vertical wall profile. After development of the patterned layer 16a, the structure of FIG. 2b is rinsed with a solvent such as isopropanol and blown dry with an inert gas. Next, the portion of the conductive layer 14 which was exposed by the developing of the resist layer 16 is removed by an etching process, such as well-known plasma etching procedures discussed, for example, by Richard L. Bersin in "Programmed Plasma Processing: The Next Generation", presented at the Kodak Microelectronics Seminar, San Diego, California, Oct. 2, 1978. The etched layer 14a shown in FIG. 2c is thus formed. Then, the structure of FIG. 2c is immersed in a second selected solvent to develop the pattern exposed in the resist layer 12. This second solvent is less active and is applied for a shorter period of time than the solvent used to develop the resist layer 16. Thus, the patterned resist layer 12a shown in FIG. 2d is formed with a narrower opening than was formed in the layer 16, while still maintaining the desirable vertical wall profile, and thus a T-shaped profile is formed in the composite resist. Line profiles may be varied by changing the solvents and exposure times used for developing the resist layers 12 and 16. The structure of FIG. 2d consisting of the substrate 10 with a fine region 18 and a T-shaped profile above region 18, exposed by the composite resist (layers 12a, 14a, and 16a) may be subjected to further processing as desired.

Figure 2E:
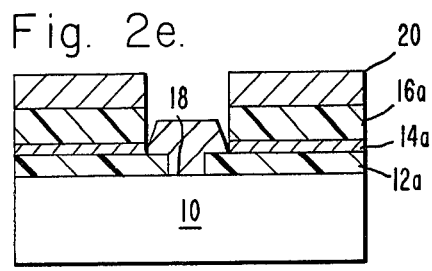

A preferred further processing step is the deposition of a metal pattern. As shown in FIG. 2e, a layer 20 of a chosen metal, such as aluminum, typically 5000 to 7000 Å thick, is deposited over the structure of FIG. 2d and into contact with the exposed substrate region 18 by a conventional chemical vapor deposition process, for example. Optionally, gold may be used as the chosen metal provided that a thin (i.e. less than 200 Å) layer of chromium is first deposited as a barrier to prevent the gold from forming a low temperature eutectic mixture during subsequent processing. As is shown in FIG. 2e, there is no metal bridging between the metal deposited on region 18 and the metal deposited on resist layer 16a. Thus, the prior art problems of difficult severance of a thick metal layer during subsequent lift-off procedures is avoided by the present invention. If a metal layer thicker than 5000 to 7000 Å is required, the upper resist layer 16 may be formed to the thickness required to accommodate deposition of the thicker metal layer without the formation of the metal bridging discussed above.

Figure 2F:
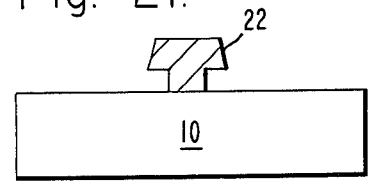

Finally, a selective solvent is applied to dissolve the resist layer 12a away from the surface of the substrate 10, carrying with it the portion of the metal layer 20 which overlies the resist layer 16a and leaving the portion 22 of the metal layer in contact with region 18 of the substrate 10, as shown in FIG. 2f. The solvent used for resist removal depends on the resist material used. For a polymethylmethacrylate resist, trichlorethylene solvent is used for resist removal. For an anhydride cross-liked polymethylmethacrylate, a 50 percent solution of acetone and ammonium hydroxide is used for resist removal. The resist solvent must be one that does not degrade the metallization during the lift-off process Optionally, before metal is deposited in FIG. 2e, the substrate 10 may be etched at region 18 to form a thinned channel in the substrate 10. Then metal is deposited and lift-off is performed as described in FIGS. 2e and 2f.

The metallization process described in FIGS. 2e and 2f finds utility in the formation of a gate structure with low resistivity. The contact area of the gate electrode has been minimized by using the process of the present invention, to provide a high-frequency device. In addition, the total area of the gate electrode has been increased by forming the electrode with a T-shaped profile, which decreases the parasitic resistance of the device. The gate electrode formed by the process of the present invention overcomes the difficulties of the prior art electrodes with a large aspect ratio previously discussed since it can be readily fabricated and has a geometry which improves significantly over prior art devices with a large aspect ratio. The previously discussed prior art problems of reduced cross-sectional area of the metal electrode, difficult severance of a thick metal deposit, and mechanical stresses of a thin, tall electrode have been avoided by the process of the present invention. Moreover, the process of the present invention has the advantage that good control of the profile of the metal lines deposited is achieved both by using a composite resist which permits control of the etching proces for forming openings in the resist and by using a lift-off process rather than a wet chemical etch process with its attendant problems as discussed in relation to the prior art process. In addition, the process of the present invention can be achieved using a single step to expose two separate layers of resist.

Furthermore, the present invention may also be used to form a non-symmetrical T-shaped gate profile, in which the cross-bar of the "T" is formed off-center. By locating the cross-bar closer to the drain than to the source, a device can be formed which has reduced potential for short circuits and high field regions between the source and gate metallizations while also having the previously discussed advantage of increased cross-sectional area of the gate. This technique finds particular application in a device having the gate located closer to the source than to the drain for enhanced device performance and a gate length of less than 0.25 micrometers.

EXAMPLE 1

This example illustrates the formation of the composite structure as described in FIG. 1. A cleaned gallium arsenide epitaxial layer, 0.3 micrometers thick, doped with an n-type impurity such as S to a concentration of $1 \times 10^{17}$ atoms per cubic centimeter, deposited on semi-insulating gallium arsenide wafer having a resistivity in the range of $10^7$ to $10^9$ ohm-centimeters, was used as the substrate and was spin-coated with a layer of Elvacite 2041 polymethylmethacrylate (obtained from DuPont Company, Wilmington, Delaware) to a thickness of 3000 Å. The structure was then heated at 180° C. for 45 minutes to drive out the solvent carrier from the coating solution. Then, intrinsically pure germanium having a resistivity of 40 ohm-centimeters was deposited on the resist layer to a thickness of 300 Å, by thermal deposition under vacuum. Next, a second layer of the polymethylmethacrylate resist was deposited on the germanium layer to a thickness of 5000 Å using spin-coating techniques. Finally, the structure was heated at 145° C. for 30 minutes. The use of this structure is described in Example 2.

EXAMPLE 2

This example illustrates the process of the present invention as described in FIG. 2. Using the composite structure prepared in accordance with Example 1, the structure was placed in an electron beam microfabrication system and exposed to a beam of electrons to expose the desired pattern in both resist layers. The electron beam was 20 kilovolts, had a diameter of approximately 1000 Å and a dose of $8 \times 10^{-5}$ coulombs per cm$^2$. Next, the structure was immersed in pure methylisobutylketone for 3 minutes to develop the pattern in the top resist layer. The structure was rinsed with isopropanol and blown dry with nitrogen gas. Then, the structure was placed in a plasma etching apparatus and the germanium layer exposed by the developed top resist layer was plasma etched with carbon tetrafluoride gas for 10 seconds. Next, the structure was immersed in a solvent consisting of 3 parts of isopropanol and 1 part of methylisobutylketone for 45 seconds to develop the pattern in the bottom resist layer. After removal from the solvent, the patterned area was sprayed for 15 seconds with a mixture having the same composition as the solvent. Next, a layer of aluminum approximately 6000 Å thick was deposited over the patterned composite resist structure formed above, by chemical vapor deposition. Finally, a metal lift-off procedure was performed using trichlorethylene solvent, to leave behind a T-shaped aluminum electrode. The process described above is particularly useful in the fabrication of a gallium arsenide field-effect transistor that has a gate structure with a low resistivity.

EXAMPLE 3

This example illustrates the process of the present invention as described in FIG. 2 in order to form a device with a non-symmetrical T-shaped gate profile. The process as described in Example 2 was followed except that during the exposure of the composite structure to the electron beam, a multi-pass secondary line was exposed adjacent to the primary electron beam exposed line and at a reduced charge density, as discussed in relation to FIG. 2. With subsequent processing as described in Example 2, a device with a non-symmetrical T-shaped profile was formed.

While the present invention has been particularly described with respect to a preferred sequence of process steps to define a predetermined region on and above a substrate, it will be understood that the invention is not limited to the particular process steps, their sequence, or the final structures depicted in the drawings. On the contrary, it is intended to cover all alternatives, modifications, and equivalents as may be included within the spirit and scope of the invention defined by the appended claims. In particular, the scope of the invention is intended to encompass the formation of a resist pattern having a controlled line profile other than the T-shaped profile discussed, including other shapes in which the bottom and top surfaces are of different lateral dimensions. In addition, it is intended to include other processes for developing the resist besides chemical etching, such as plasma stripping.

I claim:
1. A process for forming a conductive electrode of variable cross-section area which comprises the steps of:
    (a) providing a three layer mask on a substrate with the first or inner layer and third or outer layer being of a chosen electron-sensitive resist material and separated by an intermediate etch resistant conductive layer;
    (b) defining predetermined patterns in said first layer and said third layer of resist simultaneously by electron bombardment which penetrates said conductive layer;

(c) forming a first opening in said third layer while shielding said first layer with said conductive layer, said first opening having a first chosen width;

(d) successively removing portions of said intermediate and first layers to thereby produce second and third openings therein, said second opening in said intermediate layer having a second chosen width substantially equal to said first width of said first opening and said third opening in said first layer having a third chosen width smaller than said first and second widths; and (e) depositing a chosen metal in said openings formed in (c) and (d) above to thereby form said electrode of variable cross-section area, and with variable width essential replicating said widths of said first, second, and third openings.

2. A process for defining a predetermined region on and above a substrate by using a resist pattern having a controlled line profile comprising the steps of:

(a) providing said substrate;

(b) forming on said substrate a composite electron beam-sensitive resist comprising a bottom layer of said resist, a middle layer of a chosen conductive material, and a top layer of said resist to create a resist/conductor/resist composite;

(c) exposing said substrate with said resist/conductor/resist composite formed thereon to a beam of electrons so as to define a predetermined pattern in both of said resist layers, said beam having sufficient energy to expose said bottom and top layers of said resist;

(d) developing said pattern in said top layer of said resist by exposure to a first chosen solvent for a first predetermined period of time whereby said relatively thin layer of said conductive material protects said bottom layer of said resist from exposure to said first chosen solvent;

(e) removing the portion of said conductive layer which is exposed after said developing of said top layer of said resist; and (f) developing said pattern in said bottom layer of said resist by exposure to a second chosen solvent for a second predetermined period of time to thereby form a T-shaped profile in said resist/conductor/resist composite, which defines said region on and above said substrate.

3. A process as set forth in claim 2 wherein said forming of said composite resist further comprises:

(a) depositing a bottom layer of an electron beam-sensitive resist material on the surface of said substrate;

(b) depositing a relatively thin layer of a chosen conductive material on said bottom layer of said resist; and (c) depositing a top layer of said resist on said conductive layer to form said resist/conductor/resist composite on said substrate.

4. A process as set forth in claim 3 wherein:

(a) said resist material is polymethylmethacrylate;

(b) said bottom layer of said resist is deposited to a thickness of 3000 Å;

(c) said chosen conductive material is germanium and is deposited to a thickness of 300 Å; and (d) said top layer of said resist is deposited to a thickness of 5000 Å.

5. A process for depositing a metal pattern having a controlled profile on a substrate comprising the steps of:

(a) providing said substrate;

(b) forming on said substrate a composite electron beam-sensitive resist comprising a bottom layer of said resist, a middle layer of a chosen conductive material, and a top layer of said resist to create a resist/conductor/resist composite;

(c) exposing said substrate with said resist/conductor/resist composite formed thereon to a beam of electrons so as to define a predetermined pattern in both of said resist layers, said beam having sufficient energy to expose said bottom and top layers of said resist;

(d) developing said pattern in said top layer of said resist by exposure to a first chosen solvent for a first predetermined period of time whereby said relatively thin layer of said conductive material protects said bottom layer of said resist from exposure to said first chosen solvent;

(e) removing the portion of said conductive layer which is exposed after said developing of said top layer of said resist;

(f) developing said pattern in said bottom layer of said resist by exposure to a second chosen solvent for a second predetermined period of time to thereby form a T-shaped profile in said resist/conductor/resist composite, which defines said controlled profile on and above said substrate;

(g) depositing a chosen metal on said patterned resist/conductor/resist composite having said T-shaped profile and into contact with the region of said substrate defined by said controlled profile; and (h) removing said resist/conductor/resist/ composite from the surface of said substrate, to thereby remove the portion of said metal which overlies said top layer of said resist and to leave said metal pattern having said controlled profile on said substrate.

6. A process for defining a non-symmetrical T-shaped region on and above a substrate by using a resist pattern having a controlled line profile comprising the steps of:

(a) providing said substrate;

(b) forming on said substrate a composite electron beam-sensitive resist comprising a bottom layer of said resist, a middle layer of a chosen conductive material, and a top layer of said resist to create a resist/conductor/resist composite;

(c) exposing said substrate with said resist/conductor/resist composite formed thereon to a primary beam of electrons so as to define a predetermined pattern in both of said resist layers, said beam having sufficient energy to expose said bottom and top layers of said resist;

(d) after (c), exposing said substrate with said resist/conductor/resist composite formed thereon to a secondary beam of electrons in a position adjacent to the position of exposure by said primary beam of electrons, said secondary beam exposing only said top layer of said resist;

(e) developing said pattern in said top layer of said resist by exposure to a first chosen solvent for a first predetermined period of time whereby said relatively thin layer of said conductive material protects said bottom layer of said resist from exposure to said first chosen solvent;

(f) removing the portion of said conductive layer which is exposed after said developing of said top layer of said resist; and (g) developing said pattern in said bottom layer of said resist by exposure to a second chosen solvent for a second predetermined period of time to thereby form a non-symmetrical T-shaped profile in said resist/conductor/resist composite, which defines said non-symmetrical T-shaped region on and above said substrate.

7. A processs for depositing a metal pattern having a non-symmetrical T-shaped profile on a substrate comprising the steps of:
 (a) defining a non-symmetrical T-shaped region on and above said substrate by the process set forth in claim 6;
 (b) depositing a chosen metal on said resist/conductor/resist composite having said non-symmetrical T-shaped profile formed therein, and into contact with the region of said substrate defined by said profile; and
 (c) removing said resist/conductor/resist composite from the surface of said substrate, to thereby remove the portion of said metal which overlies said top layer of said resist and to leave said metal pattern having said non-symmetrical T-shaped profile on said substrate.

* * * * *